(12) United States Patent
Assefa et al.

(10) Patent No.: US 7,803,639 B2
(45) Date of Patent: Sep. 28, 2010

(54) METHOD OF FORMING VERTICAL CONTACTS IN INTEGRATED CIRCUITS

(75) Inventors: Solomon Assefa, Elmsford, NY (US); Michael C. Gaidis, Wappingers Falls, NY (US); John P. Hummel, Millbrook, NY (US); Sivananda K. Kanakasabapathy, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/619,623

(22) Filed: Jan. 4, 2007

(65) Prior Publication Data

US 2008/0164617 A1 Jul. 10, 2008

(51) Int. Cl.
*H01L 21/00* (2006.01)
*H01L 21/4763* (2006.01)
*H01L 21/44* (2006.01)

(52) U.S. Cl. .......................... 438/3; 438/620; 438/637; 257/E21.665

(58) Field of Classification Search .................... 438/3, 438/637–640, 620; 257/E21.665
See application file for complete search history.

(56) References Cited

U.S. PATENT DOCUMENTS

| | | | |
|---|---|---|---|
| 4,374,698 A | 2/1983 | Sanders et al. | |
| 4,717,447 A | 1/1988 | Dieleman et al. | |
| 4,753,709 A * | 6/1988 | Welch et al. | 438/328 |
| 6,143,640 A * | 11/2000 | Cronin et al. | 438/618 |
| 6,211,059 B1 * | 4/2001 | Inoue et al. | 438/620 |
| 6,465,314 B1 * | 10/2002 | Jiang et al. | 438/301 |
| 6,737,345 B1 * | 5/2004 | Lin et al. | 438/601 |
| 6,784,091 B1 * | 8/2004 | Nuetzel et al. | 438/618 |
| 6,995,087 B2 * | 2/2006 | Liu et al. | 438/638 |
| 7,122,386 B1 * | 10/2006 | Torng et al. | 438/3 |
| 2001/0005631 A1 * | 6/2001 | Kim et al. | 438/689 |
| 2004/0157397 A1 * | 8/2004 | Quek | 438/305 |
| 2005/0023581 A1 * | 2/2005 | Nuetzel et al. | 257/295 |
| 2007/0007657 A1 * | 1/2007 | Hineman et al. | 257/758 |
| 2007/0023806 A1 * | 2/2007 | Gaidis et al. | 257/295 |
| 2008/0217660 A1 * | 9/2008 | Aita et al. | 257/225 |

* cited by examiner

*Primary Examiner*—Hsien-ming Lee
*Assistant Examiner*—Kevin Parendo
(74) *Attorney, Agent, or Firm*—Vazken Alexanian; Ryan, Mason & Lewis, LLP

(57) ABSTRACT

A method of forming vertical contacts in an integrated circuit that couple one or more metal lines in a given metallization level to first and second features occupying different levels in the integrated circuit comprises various processing steps. A first etch stop layer is formed overlying at least of portion of the first feature while a second etch stop layer is formed overlying at least a portion of the second feature. An ILD layer is formed overlying the first and second etch stop layers. A photolithographic mask is formed overlying the ILD layer. The photolithographic mask defines a first opening over the first feature and a second opening over the second feature. A first etch process etches a first hole in the ILD layer through the first opening in the photolithographic mask that lands on the first etch stop layer and etches a second hole in the ILD layer through the second opening that lands on the second etch stop layer. Subsequently, a second etch process further etches the first hole so that it lands on the first feature.

16 Claims, 7 Drawing Sheets

US 7,803,639 B2

METHOD OF FORMING VERTICAL CONTACTS IN INTEGRATED CIRCUITS

FIELD OF THE INVENTION

The present invention is directed generally to integrated circuits, and, more particularly, to forming vertical contacts in integrated circuits.

BACKGROUND OF THE INVENTION

The patterning of magnetic tunnel junctions (MTJs) and the formation of vertical contacts between MTJs and metal interconnects remain challenging processes in the formation of magnetoresistive random access memory (MRAM) integrated circuits. In one method, an MTJ is formed and electrically coupled to an overlying metal interconnect by depositing a relatively thick metallic hard mask layer on top of the many layers of magnetic and nonmagnetic materials that will make up the MTJ. This hard mask layer is patterned into the shape of the desired MTJ by conventional photolithography and reactive ion etching (RIE). The MTJ layers are then patterned using the patterned hard mask layer as a self-aligned mask structure. Afterwards, an interlayer dielectric (ILD) layer is conformally deposited on the structure and polished so that it has a flat upper surface. Conventional photolithography and RIE are then used again to pattern a trench into the ILD layer in the shape of a desired interconnect feature. The trench is formed such that the thick hard mask layer protrudes into the trench. Finally, the trench is filled with a metallic material in order to form the interconnect feature. The thick hard mask layer, therefore, acts as both a self-aligned mask for patterning the MTJ as well as the means by which the MTJ is coupled to an overlying metal interconnect.

Unfortunately, the above-described approach to patterning an MTJ and electrically coupling the MTJ to a metal interconnect may result in non-ideal patterning of the MTJ element. When patterning the non-volatile MTJ materials with RIE, an MTJ may become electrically shorted to another MTJ or other nearby feature due to sidewall redeposition during the RIE process. The RIE process may also form an undesirable "foot" on the MTJ due to shadowing effects from the thick hard mask. Moreover, sidewall roughness from the use of the relatively thick hard mask layer may result in non-ideal MTJ shapes and irreproducible device behavior. As a result, the conventional manner of patterning an MTJ and coupling the MTJ to a metal interconnect may have a severe impact on the electrical and magnetic performance of the MTJ.

Accordingly, there is a need for a method of patterning an MTJ and electrically coupling the MTJ to a metal interconnect without using a relatively thick metallic hard mask layer in the manner described above.

SUMMARY OF THE INVENTION

Embodiments of the present invention address the above-identified need by providing methods of patterning an MTJ and electrically coupling the MTJ to a metal interconnect without using a relatively thick hard mask layer.

In accordance with an aspect of the invention, a method of forming vertical contacts in an integrated circuit that couple one or more metal lines in a given metallization level to first and second features occupying different levels in the integrated circuit comprises various processing steps. A first etch stop layer is formed overlying at least of portion of the first feature while a second etch stop layer is formed overlying at least a portion of the second feature. An ILD layer is formed overlying the first and second etch stop layers. What is more, a photolithographic mask is formed overlying the ILD layer. The photolithographic mask defines a first opening over the first feature and a second opening over the second feature. A first etch process etches a first hole in the ILD layer through the first opening in the photolithographic mask that lands on the first etch stop layer and etches a second hole in the ILD layer through the second opening that lands on the second etch stop layer. Subsequently, a second etch process further etches the first hole so that it lands on the first feature. The first and second holes are filled with one or more electrically conductive materials.

In accordance with an illustrative embodiment of the invention, an integrated circuit comprises an MTJ that occupies a level between an upper metallization level and a lower metallization level. Vertical contacts are formed between the upper metallization level and the MTJ and between the upper metallization level and the lower metallization level using processing methods in accordance with aspects of the invention. Advantageously, the vertical contact to the MTJ and the vertical contact to the lower metallization level may be formed at the same time, thereby substantially reducing the cost and complexity of manufacturing the integrated circuit.

These and other features and advantages of the present invention will become apparent from the following detailed description which is to be read in conjunction with the accompanying drawings.

DETAILED DESCRIPTION OF THE INVENTION

The present invention will be described with reference to illustrative embodiments. For this reason, numerous modifications can be made to these embodiments and the results will still come within the scope of the invention. For instance, while the illustrative embodiments describe integrated circuits comprising MTJs and various metallization features, the invention is not limited to these particular features. No limitations with respect to the specific embodiments described herein are intended or should be inferred.

Although combined in a novel manner, most of the processing steps described herein (e.g., deposition steps, etching steps and photolithography steps) are frequently performed in conventional semiconductor processing, and, as a result, will be familiar to one skilled in that art. Moreover, details of the individual processing steps used to fabricate semiconductor devices described herein may be found in a number of publications, for example, S. Wolf and R. N. Tauber, *Silicon Processing for the VLSI Era,* Volume 1, Lattice Press, 1986;

S. Wolf, *Silicon Processing for the VLSI Era*, Vol. 4: *Deep-Submicron Process Technology*, Lattice Press, 2003; and S. M. Sze, *VLSI Technology, Second Edition*, McGraw-Hill, 1988, all of which are incorporated herein by reference. It is also emphasized that the descriptions provided herein are not intended to encompass all of the processing steps which may be required to successfully form a functional device. Rather, certain processing steps which are conventionally used in forming integrated circuit devices, such as, for example, wet cleaning and annealing steps, are purposefully not described herein for economy of description. However one skilled in the art will readily recognize those processing steps omitted from this generalized description.

Aspects of the invention allow an MTJ to be patterned using a relatively thin electrically conductive hard mask layer. The MTJ, in turn is electrically coupled to an overlying metal interconnect through the use of a vertical contact, rather than solely through the hard mask layer itself. This vertical contact acts to separate the MTJ from the overlying metal interconnect so that there is less chance that the metal interconnect will electrically short the MTJ to itself or to another nearby feature. Advantageously, the vertical contact to the MTJ may be formed with the same processing steps that are utilized to form vertical contacts between two metallization levels in other parts of the integrated circuit. No additional photolithographic masks are required, thereby substantially reducing the cost and complexity of manufacturing the integrated circuit.

Figure 1:
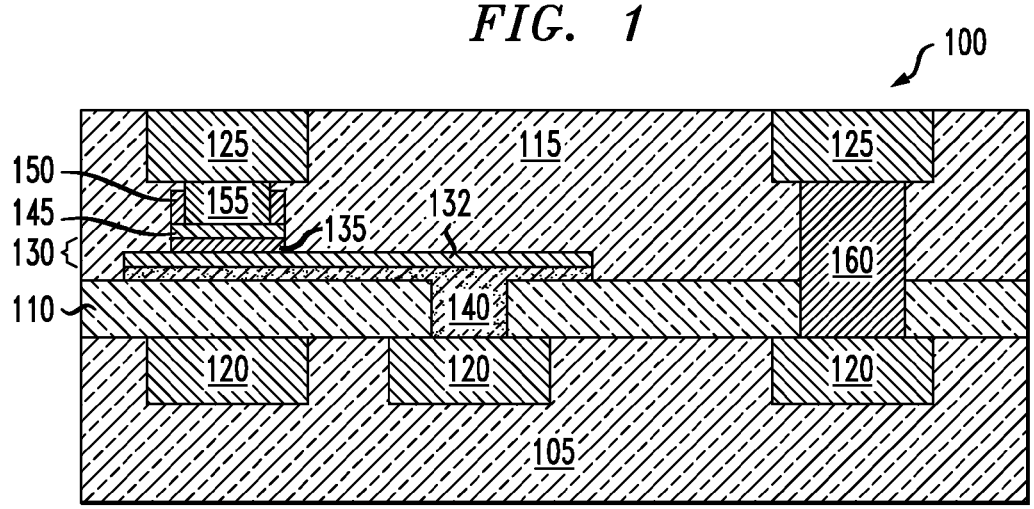
FIG. 1 shows a sectional view of a region of an integrated circuit in accordance with a first illustrative embodiment of the invention.

FIG. 1 shows a sectional view of a region 100 of an integrated circuit in accordance with a first illustrative embodiment of the invention. For purposes of this embodiment, the integrated circuit comprises an MTJ that occupies a region between two metallization levels. The region comprises a lower ILD layer 105, a middle ILD layer 110 and an upper ILD layer 115. Built into these ILD layers are various metal interconnects, namely, lower metal interconnects 120 and upper metal interconnects 125. An MTJ 130 occupies the leftmost portion of the region. The MTJ comprises a lower MTJ layer 132 and an upper MTJ layer 135. The lower MTJ layer contacts the central lower metal interconnect through an MTJ electrode 140. Built on top of the upper MTJ layer is an MTJ hard mask layer 145 and an etch stop layer 150. An MTJ vertical contact 155 electrically couples the MTJ hard mask layer to the leftmost upper metal interconnect. A metallization vertical contact 160 electrically couples the rightmost upper metal interconnect to the rightmost lower metal interconnect.

The function of the etch stop layer 150 will become more evident below when describing a process for forming the region 100. In accordance with an aspect of the invention, both the etch stop layer and the middle ILD layer 110 comprise the same dielectric material, while the upper ILD layer 115 comprises a dielectric material different from the etch stop layer and the middle ILD layer. The etch stop layer and the middle ILD layer may, for example, comprise silicon nitride while the upper ILD layer comprises silicon oxide, or the opposite may be true. The MTJ electrode layer 140 will preferably comprise a refractory material such as tantalum, tantalum nitride, titanium or titanium nitride. Moreover, the lower metal interconnects 120, the upper metal interconnects 125, the MTJ vertical contact 155 and the metallization vertical contact 160 will preferably comprise a conductive metal like copper or aluminum. The MTJ hard mask layer 145 will preferably comprise a metallic material such as, but not limited to, tantalum, tantalum nitride, aluminum, copper, titanium, titanium nitride, tungsten, platinum and ruthenium.

The MTJ 130, moreover, preferably comprises various sublayers that give the MTJ the ability to store a memory state. The compositions, functions and arrangements of the various sublayers that may form the MTJ will be familiar to those skilled in the art. An MTJ will typically comprise a free ferromagnetic layer and a fixed ferromagnetic layer separated by a thin dielectric barrier (a tunnel barrier). The resistance of the memory cell depends on the direction of magnetization of the free ferromagnetic layer relative to the direction of magnetization of the fixed ferromagnetic layer. In other words, the magnetization of the free layer may be oriented parallel or anti-parallel to the fixed layer, representing either a logic "0" or a logic "1." The state of the cell can be sensed by measuring the MTJs resistance.

Many different materials may be used in the MTJ 130 such as cobalt-iron, cobalt-iron-boron, nickel-iron, platinum-manganese, ruthenium, aluminum oxide, manganese oxide, iridium-manganese as well as several others. Each of the lower and upper MTJ layers 132, 135 will comprise some subset of the various sublayers that form the MTJ. The lower MTJ layer may, as just one example, comprise the fixed ferromagnetic layer and dielectric barrier of the MTJ, while the upper MTJ layer comprises the free ferromagnetic layer. Nonetheless, the particular arrangement and composition of the sublayers forming the MTJ and their particular separation into the lower and upper MTJ layers are not critical to the functionality of aspects of the invention.

Figure 2A:
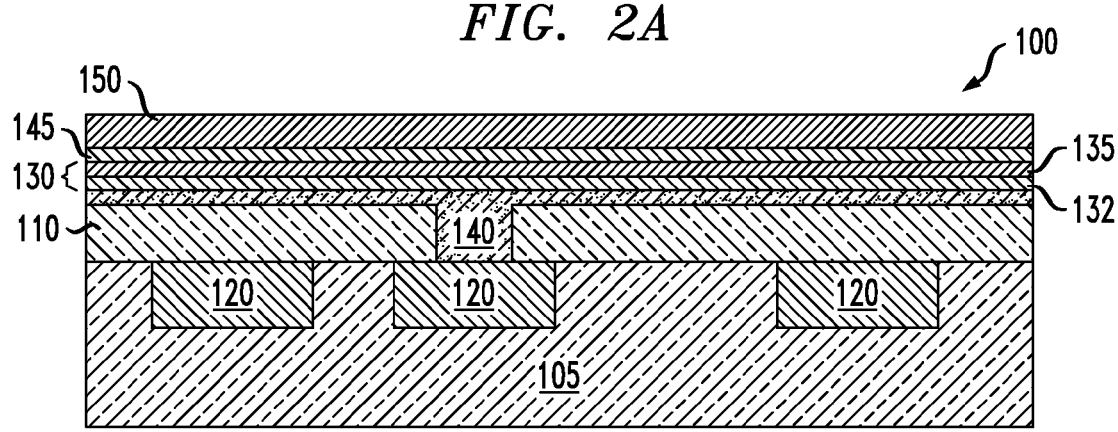
FIGS. 2A-2F show sectional views of the FIG. 1 region during various stages of processing.

FIGS. 2A-2F show sectional views of the region 100 during various stages of processing. FIG. 2A shows the region after the lower and middle ILD layers 105, 110 and the lower metal interconnects 120 have been formed. In addition the MTJ electrode 140 has been deposited and polished such that it fills the hole in the middle ILD layer 110 and contacts the central lower metal interconnect. What is more, the lower and upper MTJ layers 132, 135, the MTJ hard mask layer 145 and the etch stop layer 150 have been blanket deposited on the MTJ electrode. As described above, the dielectric etch stop layer and the middle ILD layer comprise the same dielectric material (e.g., silicon nitride or silicon oxide).

Figure 2B:
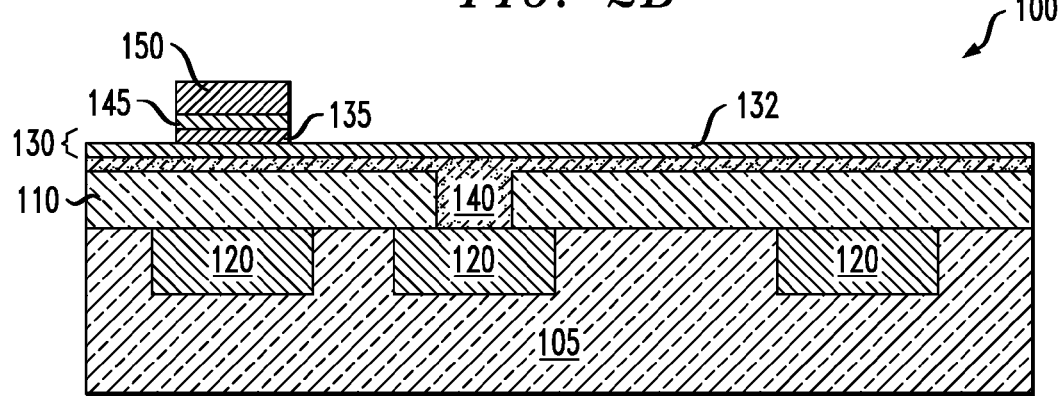
Figure 2C:
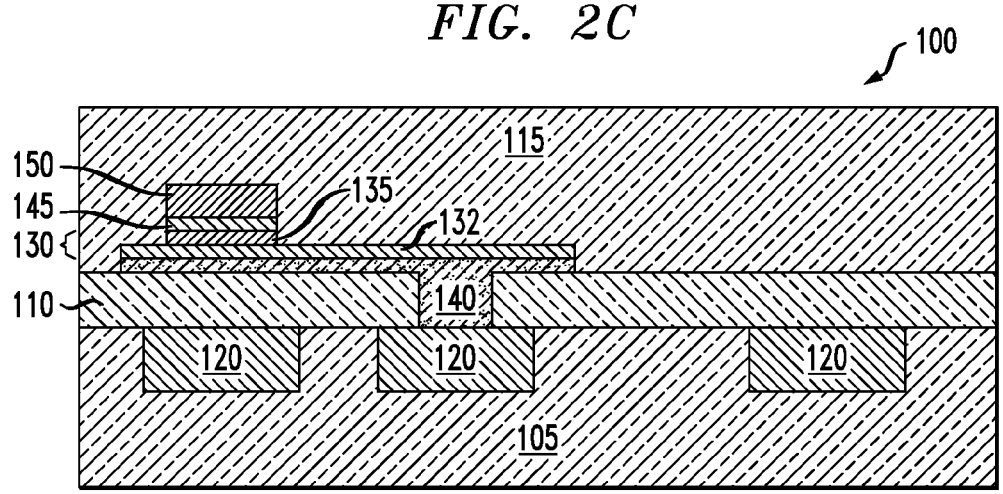

Once formed to this point, conventional photolithography and RIE (or an alternative suitable anisotropic etching technique) are used to pattern the etch stop layer 150, the MTJ hard mask layer 145 and the upper MTJ layer 135, as shown in FIG. 2B. Subsequently, conventional photolithography and RIE are used again to remove portions of the lower MTJ layer 132 and the MTJ electrode 140 overlying the rightmost lower metal interconnect 120. The upper ILD layer 115 is then conformally deposited on the film stack and polished to create a substantially flat uppermost surface, as shown in FIG. 2C.

Figure 2D:
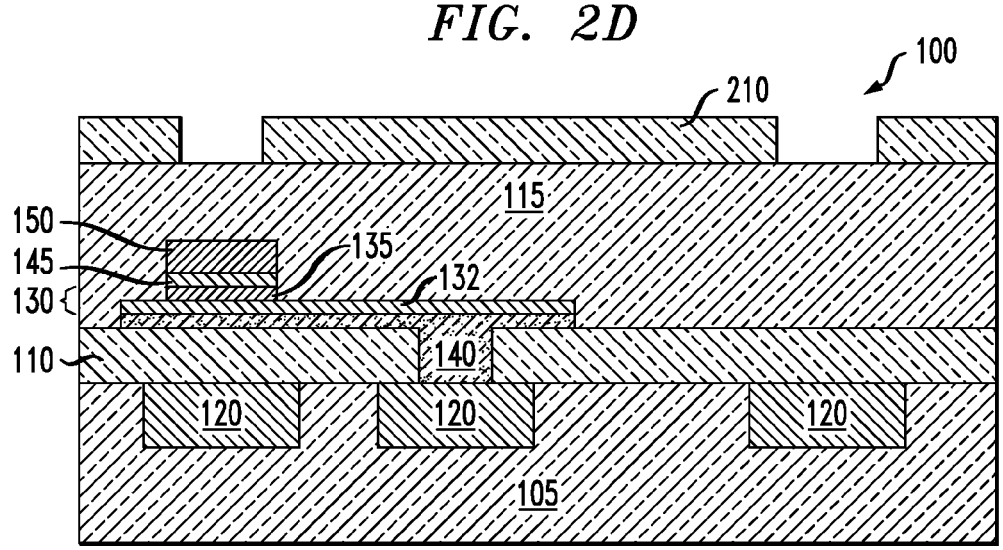

A photolithographic mask 210 is then formed on the uppermost surface of the upper ILD layer 115 and patterned, as shown in FIG. 2D. The photolithographic mask defines openings where vertical contacts are desired, to be precise, over the MTJ 130 and over the rightmost metal interconnect 120. If desired, the openings over the MTJ and over the rightmost metal interconnect may have different diameters, ultimately resulting in an MTJ vertical contact 155 and a metallization vertical contact 160 with different diameters. It may, for example, be advantageous to have the MTJ vertical contact have a smaller diameter than the metallization vertical contact. The MTJ vertical contact is required to land on the MTJ which may be relatively small in comparison to the metal interconnect. In contrast, it may be desirable to make the metallization vertical contact relatively large to reduce the electrical resistance of this contact and to reduce resistance-capacitance induced delays in the integrated circuit's metallization levels.

Figure 2E:
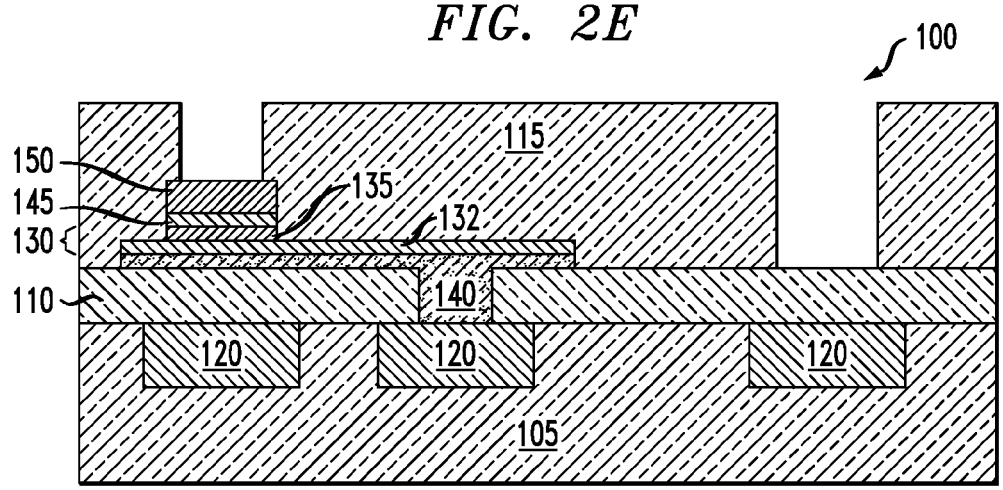

With the above-described photolithographic mask 210 in place, the region 100 is exposed to another RIE process. In accordance with an aspect of this invention, this RIE process etches the upper ILD layer 115 through the openings in the photolithographic mask until it reaches either the etch stop layer 150 or the middle ILD layer 110, as shown in FIG. 2E after the photolithographic mask is stripped. If, for example, the etch stop layer and middle ILD layer comprise silicon nitride and the upper ILD layer comprises silicon oxide, then this RIE process would preferably etch silicon oxide with a relatively high rate but not etch, or only very slowly etch, silicon nitride. Conversely, if the etch stop layer and middle ILD layer comprise silicon oxide and the upper ILD layer comprises silicon nitride, then the opposite would be true; the RIE process would preferably selectively etch silicon nitride and only slowly etch silicon oxide.

Advantageously, the etch stop layer 150 in combination with a selective RIE process allows a single RIE process to etch holes in two different portions of the region 100 that have substantially different depths and, optionally, different diameters. RIE processes that etch silicon nitride or silicon oxide selectively to one another are frequently practiced in conventional semiconductor processing. As a result, the details of these processes will be familiar to one skilled in the art and need not be detailed herein. These selective RIE processes frequently comprise various combinations of reactants such as $CH_xF_{4-x}$, $C_xF_{2x+2}$ (e.g., $C_2F_6$ and $C_3F_8$), $SiF_4$, $NF_3$, HBr, $O_2$, $H_2$ and Ar. They are described in, for example, U.S. Pat. No. 4,374,698, entitled "Method of manufacturing a semiconductor device," and U.S. Pat. No. 4,717,447, entitled "Method of manufacturing a semiconductor device by means of plasma etching," both of which are incorporated herein by reference.

Figure 2F:
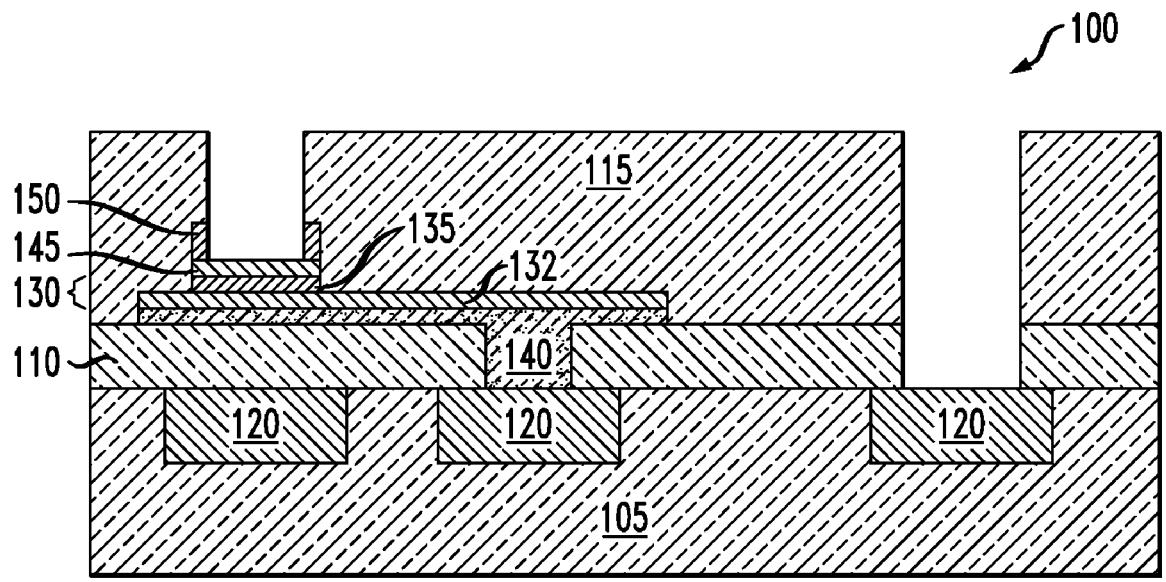

After this selective RIE process is completed, the region 100 is exposed to another RIE process. In contrast to the previous RIE process, this second RIE process is configured to selectively etch the dielectric material constituting the etch stop layer 150 and the middle ILD layer 110 and to only very slowly etch the dielectric material constituting the upper ILD layer 115. The etch will also preferably not etch, or only very slowly etch, metallic materials. Accordingly, this RIE process extends the leftmost hole in the upper ILD layer through the etch stop layer to the MTJ hard mask layer 145 and extends the rightmost hole in the upper ILD layer through the middle ILD layer to the rightmost lower metal interconnect 120, as shown in FIG. 2F. If the etch stop layer and the middle ILD layer are of approximately the same thickness, it is unnecessary to overetch to any great extent on either the MTJ hard mask layer or on the lower metal interconnect during this RIE process. In this way, damage to these metallic features from this RIE process can be minimized.

RIE processes that etch dielectric materials selectively with respect to metal materials are well known in the semiconductor art and, therefore, need not be detailed here. The fluorine-containing reactants described above for use in etching silicon nitride and silicon oxide, for example, typically do not readily etch metallic materials. Instead, chlorine- and/or boron-containing RIE reactants such as $Cl_2$, $CCl_2$, $BCl_3$, $SiCl_4$ and HBr are frequently used to etch metallic features.

In subsequent processing, trenches are formed in the upper ILD layer 115 by conventional photolithography and RIE in the shape of the desired upper metal interconnects 125. Deposition of a metallic material into the remaining holes/trenches and the removal of any excess metallic material from the top of the upper ILD layer by polishing results in the formation of the MTJ vertical contact 155, the metallization vertical contact 160 and the upper metal interconnects 125. Subsequent to this processing, the region 100 appears as shown in FIG. 1.

Figure 3:
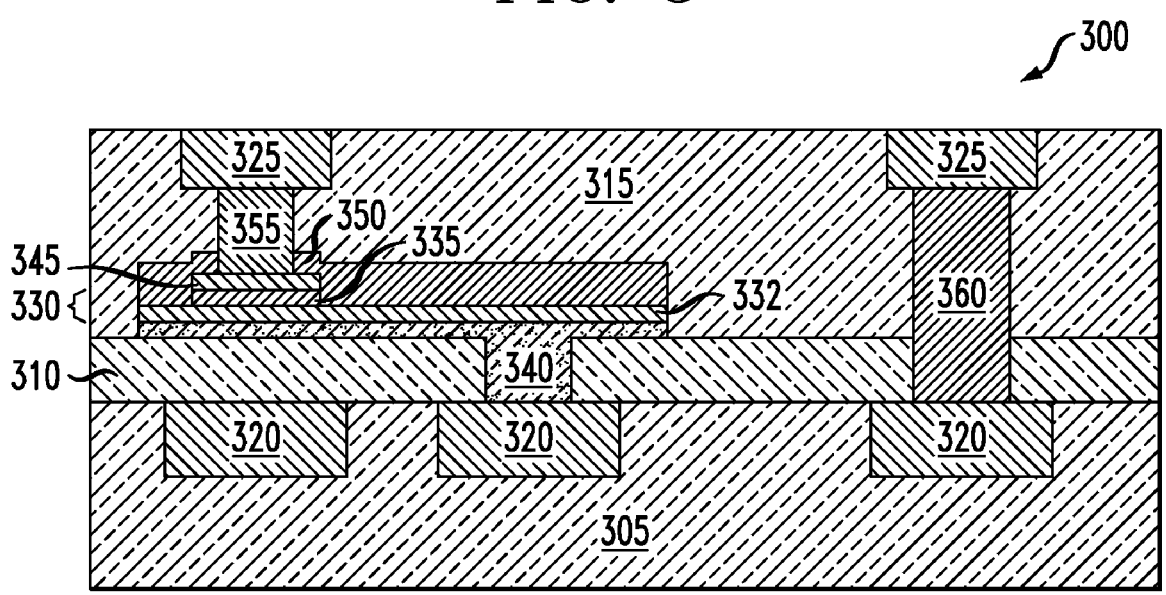
FIG. 3 shows a sectional view of a region of an integrated circuit in accordance with a second illustrative embodiment of the invention.

One skilled in the art will recognize that several changes and modification can be made to the features and the processes just described and the results will still come within the scope of this invention. FIG. 3, for example, goes on to show a sectional view of a region 300 of an integrated circuit in accordance with a second illustrative embodiment of the invention.

The region 300 has several similarities to the region 100 shown in FIG. 1. The region 300 comprises a lower ILD layer 305, a middle ILD layer 310 and an upper ILD layer 315. Built into these ILD layers are various metal interconnects, namely, lower metal interconnects 320 and upper metal interconnects 325. An MTJ 330 occupies the leftmost portion of the region. The MTJ comprises a lower MTJ layer 332 and an upper MTJ layer 335. The lower MTJ layer contacts the central lower metal interconnect through an MTJ electrode 340. Built on top of the upper MTJ layer is an MTJ hard mask layer 345 and an etch stop layer 350. An MTJ vertical contact 355 electrically couples the MTJ hard mask layer to the leftmost upper metal interconnect. A metallization vertical contact 360 electrically couples the rightmost upper metal interconnect to the rightmost lower metal interconnect.

Figure 4A:
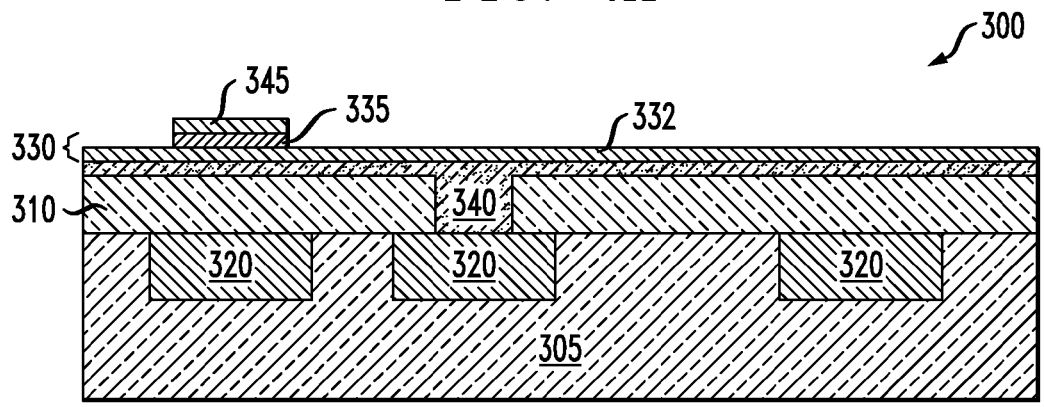
FIGS. 4A-4E show sectional views of the FIG. 3 region during various stages of processing.

FIGS. 4A-4E show the region 300 during various stages of processing. FIG. 4A shows the region 300 after the lower and middle ILD layers 305, 310 and lower metal interconnects 320 have been formed. In addition, the MTJ electrode 340 has been deposited and polished such that it fills the hole in the middle ILD layer and contacts the central lower metal interconnect. What is more, the lower and upper MTJ layers 332, 335 and the MTJ hard mask layer 345 have been blanket deposited on the MTJ electrode, and the upper MTJ layer and the MTJ hard mask layer have been patterned with convention photolithography and RIE.

Figure 4B:
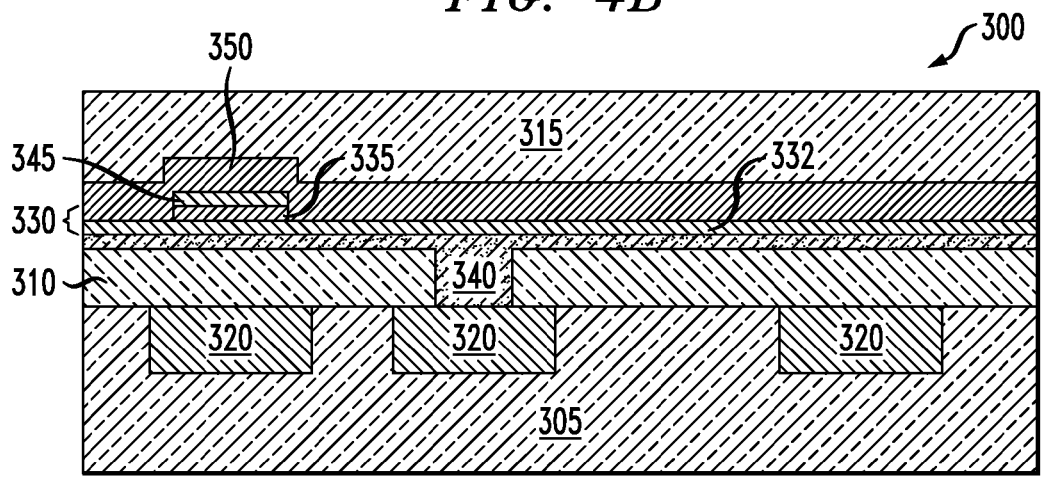
Figure 4C:
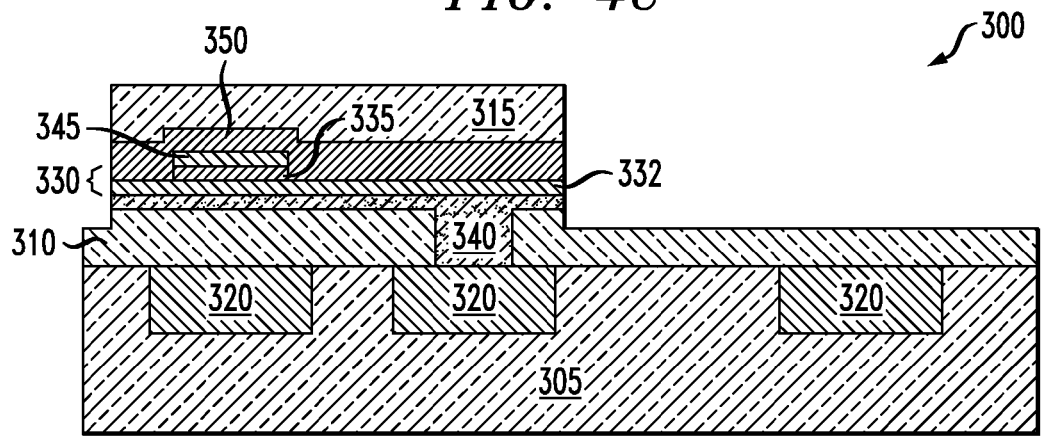

Next, the etch stop layer 350 and the upper ILD layer 315 are blanket deposited on the film stack and the upper ILD layer is polished so that it has a substantially flat uppermost surface, as shown in FIG. 4B. In accordance with an aspect of the invention, the etch stop layer and the middle ILD layer comprise one dielectric material, while the upper ILD layer comprises a different dielectric material. The etch stop layer and middle ILD may, for example, comprise silicon nitride while the upper ILD layer comprises silicon oxide, or the opposite may be true. Conventional photolithography and RIE are then used to remove portions of the upper ILD layer, the etch stop layer, the MTJ hard mask layer 345, and the MTJ electrode 340 in the areas to the sides of the MTJ 330. The middle ILD layer is also thinned somewhat in the etched areas, as shown in FIG. 4C. Indeed the middle ILD layer is preferably thinned in the etched areas to a thickness near that of the etch stop layer.

Figure 4D:
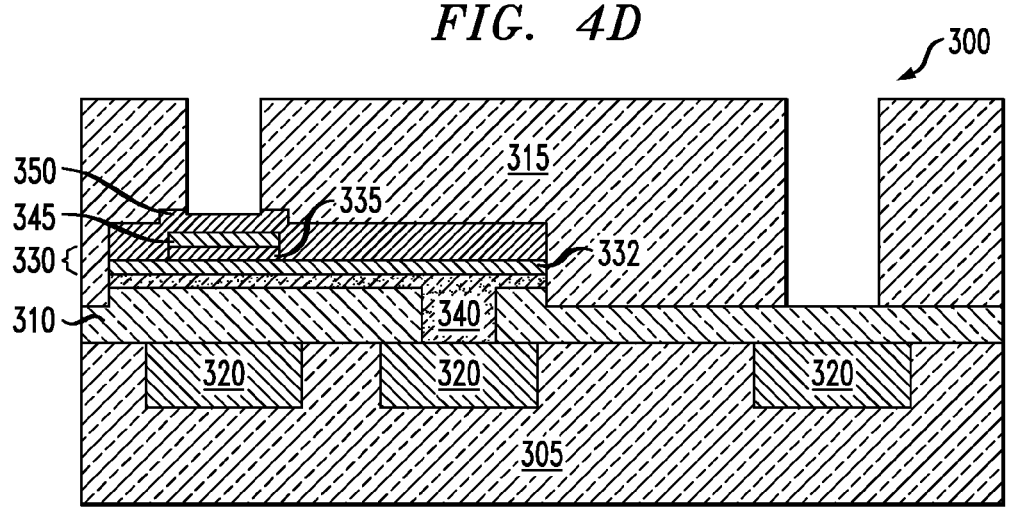
Figure 4E:
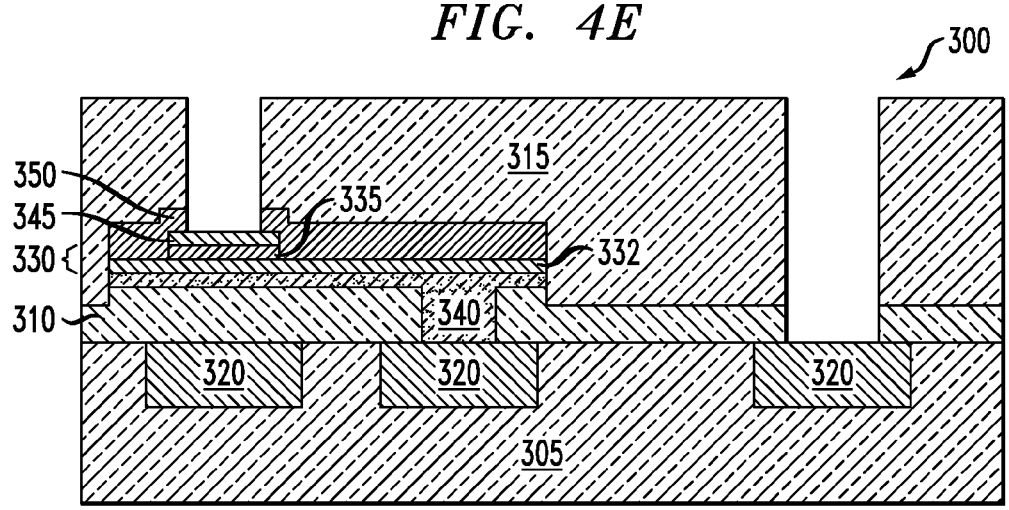

In further processing, additional upper ILD layer dielectric material is deposited on the film stack and polished to re-form the upper ILD layer 315 over the entire film stack. Conventional photolithography and RIE are then used to etch holes in the upper ILD layer that land on the etch stop layer 350 and the thinned middle ILD layer 310, as shown in FIG. 4D. Like the RIE process used on the region 100 in FIG. 2E, the RIE process used here will preferably be one that readily etches the dielectric material constituting the upper ILD layer but only slowly etches the dielectric material constituting the etch stop layer and the middle ILD layer. The region is then exposed to another RIE process to extend the holes to the MTJ hard mask layer 345 and the rightmost lower metal interconnect 320, as shown in FIG. 4E. This particular RIE process will preferably etch the dielectric material constituting the etch stop layer and middle ILD layer, but only slowly etch the dielectric material constituting the upper ILD layer and the metallic materials constituting the MTJ hard mask layer and the lower metal interconnect. Again, if the middle ILD layer is thinned over the rightmost lower metal interconnect to a thickness similar to that of the etch stop layer, it may be unnecessary to significantly overetch on either the MTJ hard mask layer or the rightmost lower metal interconnect to accomplish the process shown in FIG. 4E.

Afterwards, trenches are formed in the upper ILD layer 315 by conventional photolithography and RIE in the shape of the desired upper metal interconnects 325. Deposition of a metallic material into the remaining holes/trenches and the removal of any excess metallic material from the top of the upper ILD layer by polishing results in the formation of the region 300 as it appears in FIG. 3.

It will be noted that it may be unnecessary in the process shown in FIGS. 4A-4E to overetch on the MTJ hard mask layer to as great an extent as required in the process shown in FIGS. 2A-2F. This may be advantageous, allowing a thinner MTJ hard mask layer to be used in the process shown in FIGS. 4A-4E.

Figure 5:
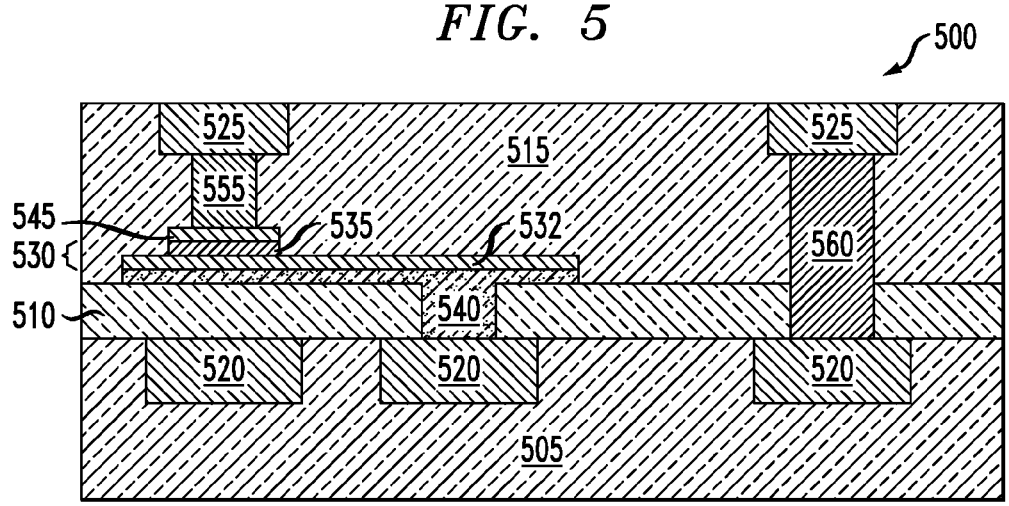
FIG. 5 shows a sectional view of a region of an integrated circuit in accordance with a third illustrative embodiment of the invention.

Continuing even further in describing aspects of the invention, FIG. 5 shows a sectional view of a region 500 of an integrated circuit in accordance with a third illustrative embodiment of the invention. Here, the region comprises a lower ILD layer 505, a middle ILD layer 510 and an upper ILD layer 515. Built into these ILD layers are lower metal interconnects 520 and upper metal interconnects 525. An MTJ 530 occupies the leftmost portion of the region. The MTJ comprises a lower MTJ layer 532 and an upper MTJ layer 535. The lower MTJ layer contacts the central lower metal interconnect through an MTJ electrode 540. Built on top of the upper MTJ layer is an MTJ hard mask layer 545. An MTJ vertical contact 555 electrically couples the MTJ hard mask layer to the leftmost upper metal interconnect. A metallization vertical contact 560 electrically couples the rightmost upper metal interconnect to the rightmost lower metal interconnect. It will be observed that the region 500, unlike the previous two embodiments, does not comprise a dielectric etch stop layer.

Figure 6A:
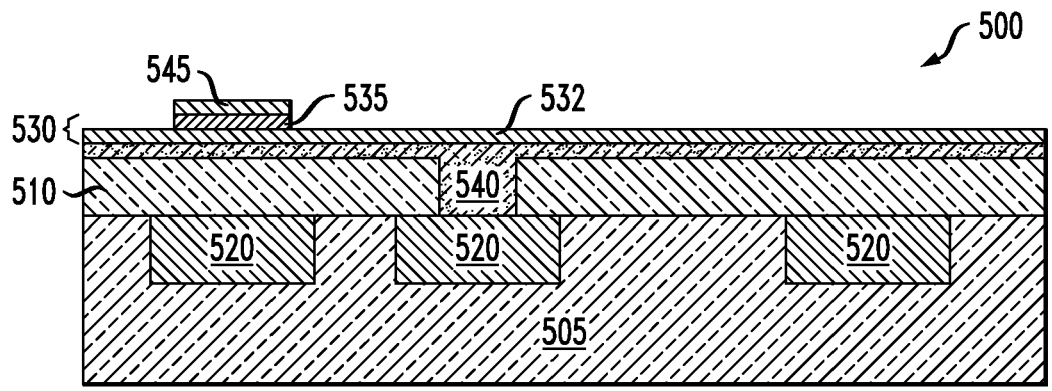
FIGS. 6A-6E show sectional views of the FIG. 5 region during various stages of processing.

FIGS. 6A-6E go on to show the region 600 during various stages of processing. FIG. 6A shows the region 500 after the lower and middle ILD layers 505, 510 and the lower metal interconnects 520 have been formed. In addition the MTJ electrode 540 has been deposited and polished such that it fills the hole in the middle ILD layer and contacts the central lower metal interconnect. What is more, the lower and upper MTJ layers 532, 535 and the MTJ hard mask layer 545 have been blanket deposited on the MTJ electrode, and the upper MTJ layer and the MTJ hard mask layer have been patterned with conventional photolithography and RIE.

Figure 6B:
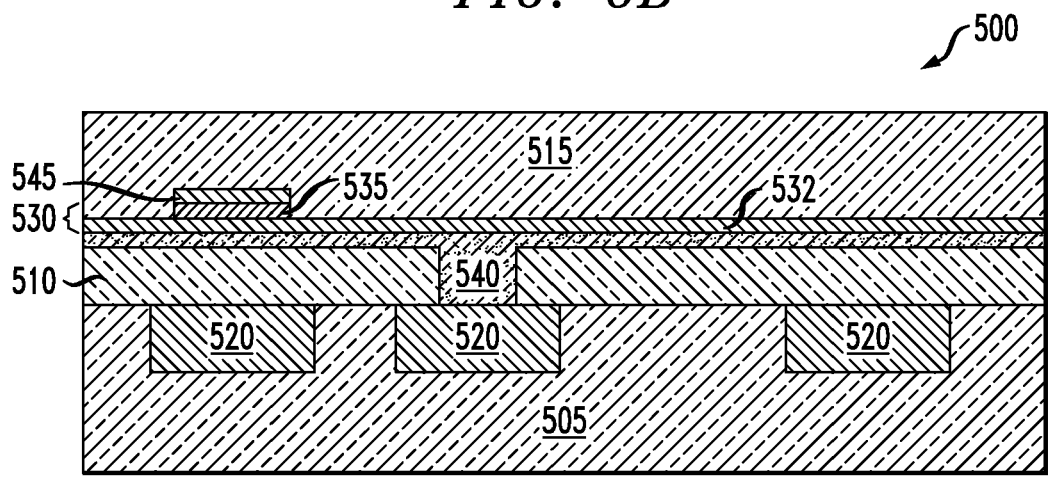
Figure 6C:
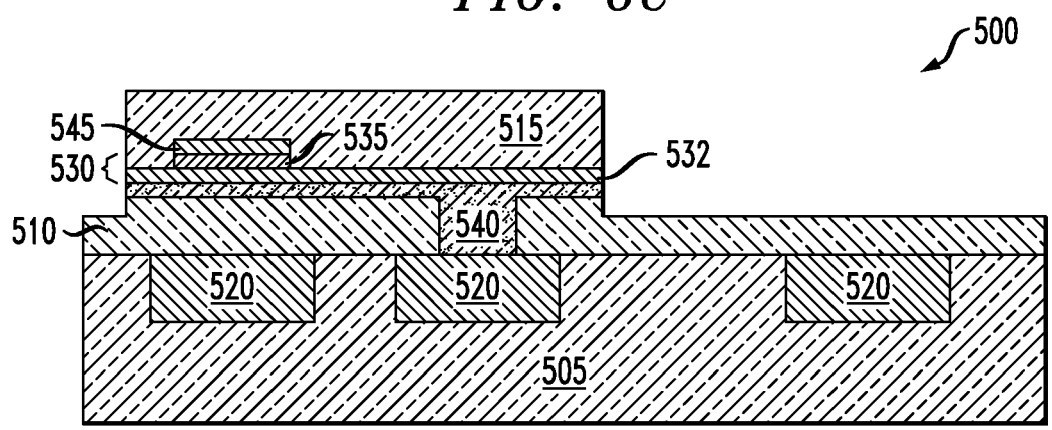

Once formed to this point, the upper ILD layer 515 is blanket deposited on the film stack and polished so that its uppermost surface is substantially flat, as shown in FIG. 6B. In accordance with an aspect of the invention, the upper ILD layer and the middle ILD layer 510 comprise different dielectric materials. Conventional photolithography and RIE are then used to remove portions of the upper ILD layer, the MTJ hard mask layer 545, and the MTJ electrode 540 in the areas to the sides of the MTJ 530. The middle ILD layer is also thinned somewhat in the etched areas, as shown in FIG. 6C.

Figure 6D:
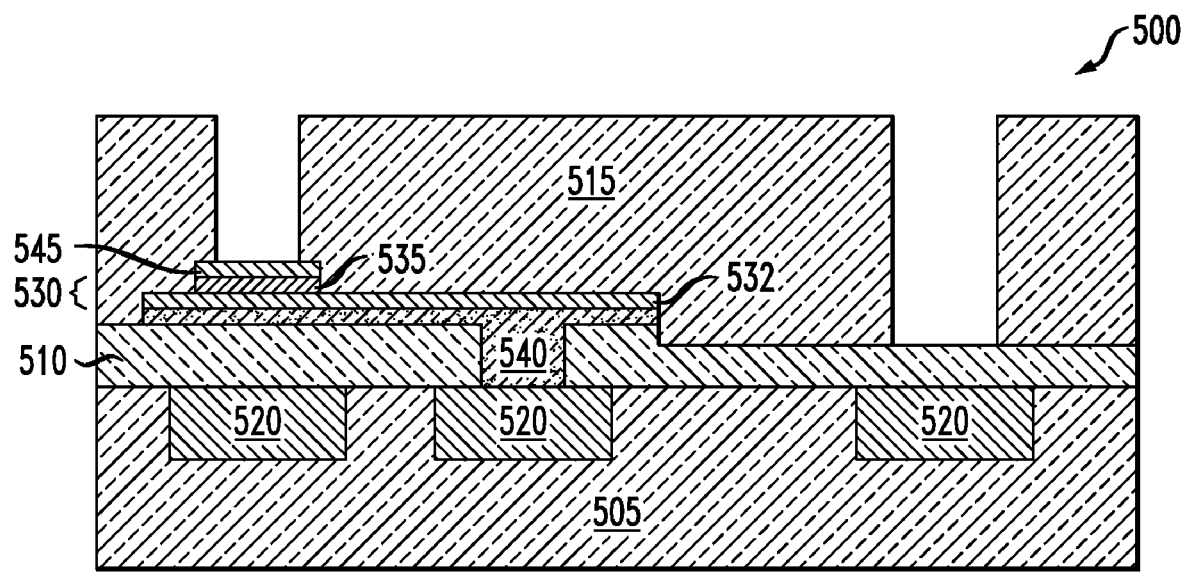

In further processing, additional upper ILD layer dielectric material is deposited on the film stack and polished to re-form the upper ILD layer 515 over the entire film stack. Conventional photolithography and RIE are used to etch holes in the upper ILD layer that land on the MTJ hard mask layer 545 and the thinned middle ILD layer 510, as shown in FIG. 6D. The RIE process used here will preferably be one that selectively etches the dielectric material constituting the upper ILD layer but does not etch, or only very slowly etches, the dielectric material constituting the middle ILD layer and the metallic material constituting the MTJ hard mask layer. As before, such a selective RIE process will be familiar to one skilled in the art.

Figure 6E:
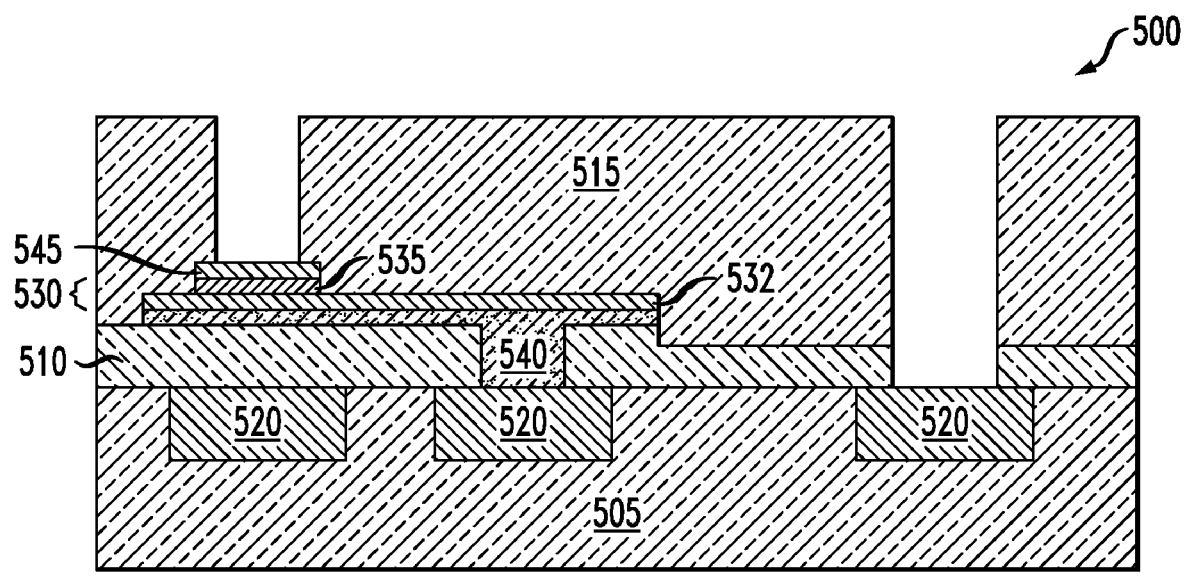

The region 500 is then exposed to another RIE process to extend the hole contacting the middle ILD layer 510 to the rightmost lower metal interconnect 520, as shown in FIG. 6E. This particular RIE process will preferably selectively etch the dielectric material constituting the middle ILD layer but not etch metallic materials to any great extent. Again, if the middle ILD layer 510 is thinned in prior processing, the amount of etching that the MTJ hard mask layer 545 is exposed to as the middle ILD layer is opened over the rightmost metal interconnect may be reduced.

Afterwards, trenches are formed in the upper ILD layer 515 by conventional photolithography and RIE in the shape of the desired upper metal interconnects 525. Deposition of a metallic material into the remaining holes/trenches and the removal of any excess metallic material from the top of the upper ILD layer by polishing results in the formation of the region 500 as it appears in FIG. 5.

The features just described are part of the design for integrated circuit chips. The chip design is created in a graphical computer programming language, and is stored in a computer storage medium (such as a disk, tape, physical hard drive or virtual hard drive such as in a storage access network). If the designer does not fabricate chips or photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are formed on a wafer. The photolithographic masks are utilized to define areas of the wafer (and/or the layers thereon) to be etched or otherwise processed.

The resulting integrated circuit chips can be distributed by the fabricator in raw wafer form (i.e., as a single wafer that has multiple unpackaged chips), as a bare die, or in packaged form. In the latter case, the chip is mounted in a single chip package (e.g., plastic carrier with leads that are affixed to a motherboard or other higher level carrier) or in a multichip package (e.g., ceramic carrier that has either or both surface interconnections or buried interconnections). In any case, the chip is then integrated with other chips, discrete circuit elements, and/or other signal processing devices as part of either an intermediate product (e.g., motherboard) or an end product. The end product can be any product that includes integrated circuit chips, ranging from toys and other low-end applications to advanced computer products having a display, a keyboard or other input device, and a central processor.

Although illustrative embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A method of forming vertical contacts in an integrated circuit that couple one or more metal lines in a metallization level to a first and a second feature, the first and second features each occupying different levels in the integrated circuit that are lower than the metallization level, the method comprising the steps of:

forming a first etch stop layer overlying at least a portion of the first feature;

forming a second etch stop layer overlying at least a portion of the second feature;

forming an interlayer dielectric layer overlying the first and second etch stop layers;

forming a photolithographic mask overlying the interlayer dielectric layer, the photolithographic mask defining a first opening over the first feature and a second opening over the second feature;

performing a first etch process with the photolithographic mask, the first etch process operative to etch a first hole in the interlayer dielectric layer through the first opening in the photolithographic mask, the first hole landing on the first etch stop layer upon completion of the first etch process, and to etch a second hole in the interlayer dielectric layer through the second opening in the photolithographic mask, the second hole landing on the second etch stop layer upon completion of the first etch process;

performing a second etch process, the second etch process being at least operative to further etch the first hole so that it lands on the first feature; and filling the first and second holes with one or more electrically conductive materials;

wherein the first feature comprises a first metal interconnect and the second feature comprises a magnetic tunnel junction overlying a second metal interconnect, the first and second metal interconnects being distinct structures both occupying a given level in the integrated circuit.

2. The method of claim 1, wherein the second etch process is further operative to etch the second hole so that it lands on the second feature.

3. The method of claim 1, where the interlayer dielectric layer comprises a material different from that of at least one of the first and second etch stop layers.

4. The method of claim 1, wherein the first and second etch stop layers comprise substantially a same material.

5. The method of claim 1, wherein the first etch stop layer comprises a different material than the second etch stop layer.

6. The method of claim 1, wherein at least one of the first and second etch stop layers comprises a dielectric material.

7. The method of claim 6, wherein the dielectric material comprises a material chosen from a group consisting of silicon oxide and silicon nitride.

8. The method of claim 1, wherein at least one of the first and second etch stop layers comprises a metallic material.

9. The method of claim 8, wherein the metallic material comprises a material chosen from a group consisting of tantalum, tantalum nitride, aluminum, copper, titanium, titanium nitride, tungsten, platinum and ruthenium.

10. The method of claim 1, wherein the first and second etch stop layers comprise silicon oxide and the interlayer dielectric layer comprises silicon nitride, or the first and second etch stop layers comprise silicon nitride and the interlayer dielectric layer comprises silicon oxide.

11. The method of claim 1, wherein the first opening in the photolithographic mask has a different diameter than the second opening in the photolithographic mask.

12. The method of claim 1, wherein performing at least one of the first and second etch processes comprises reactive ion etching.

13. The method of claim 12, wherein the reactive ion etching is performed with reactants chosen from a group consisting of $SiF_4$ and $NF_3$.

14. The method of claim 1, further comprising forming and patterning a second photolithographic mask overlying the interlayer dielectric layer.

15. The method of claim 14, wherein the second photolithographic mask defines an opening over at least one of the first and second holes, the opening being locally in a shape of a line having a width larger than a diameter of the at least one of the first and second holes.

16. The method of claim 1 wherein the magnetic tunnel junction is electrically connected to a third metal interconnect occupying the given level in the integrated circuit and is not electrically connected to the first and second metal interconnects.

* * * * *